(12) United States Patent
Lo

(10) Patent No.: US 11,502,194 B2
(45) Date of Patent: Nov. 15, 2022

(54) MOSFET MANUFACTURING METHOD

(71) Applicant: CSMC TECHNOLOGIES FAB2 CO., LTD., Wuxi (CN)

(72) Inventor: Tse-huang Lo, Wuxi (CN)

(73) Assignee: CSMC TECHNOLOGIES FAB2 CO., LTD., Wuxi (CN)

(*) Notice: Subject to any disclaimer, the term of this patent is extended or adjusted under 35 U.S.C. 154(b) by 118 days.

(21) Appl. No.: 17/263,207

(22) PCT Filed: Jul. 25, 2019

(86) PCT No.: PCT/CN2019/097646
§ 371 (c)(1),
(2) Date: Jan. 26, 2021

(87) PCT Pub. No.: WO2020/020276
PCT Pub. Date: Jan. 30, 2020

(65) Prior Publication Data
US 2021/0143274 A1    May 13, 2021

(30) Foreign Application Priority Data
Jul. 27, 2018 (CN) .......................... 201810846710.4

(51) Int. Cl.
*H01L 21/336* (2006.01)
*H01L 29/78* (2006.01)
(Continued)

(52) U.S. Cl.
CPC ...... *H01L 29/7825* (2013.01); *H01L 29/4236* (2013.01); *H01L 29/49* (2013.01); *H01L 29/7869* (2013.01)

(58) Field of Classification Search
CPC ......... H01L 29/06; H01L 29/08; H01L 29/49; H01L 29/66; H01L 29/78; H01L 29/417;
(Continued)

(56) References Cited

U.S. PATENT DOCUMENTS 5,981,995 A    11/1999 Selcuk
6,191,446 B1   2/2001 Gardner et al.
(Continued)

FOREIGN PATENT DOCUMENTS

CN    101452859    6/2009
CN    103928516    7/2014

OTHER PUBLICATIONS

International Search Report (w/ English translation) PCT/CN2019/097646, dated Sep. 20, 2019, 4 pages.
(Continued)

*Primary Examiner* — Chuong A Luu
(74) *Attorney, Agent, or Firm* — Dority & Manning, P.A.

(57) ABSTRACT

An MOSFET manufacturing method, comprising: etching an oxide layer and a silicon nitride layer on a first conductivity type well region, and forming an opening exposing the first conductivity type well region; etching the first conductivity type well region to form a first trench; depositing a medium oxide layer and performing back etching; etching the first conductivity type well region to form a second trench that is connected to the first trench, and forming a grid on an inner wall of the second trench, forming a second conductivity type well region in the first conductivity type well region at the bottom of the second trench, and forming a source in the second conductivity type well region; and removing the oxide layer and the silicon nitride layer, and forming a drain at the first conductivity type well region outside of the trench.

15 Claims, 5 Drawing Sheets

(51) Int. Cl.
*H01L 29/423* (2006.01)
*H01L 29/49* (2006.01)
*H01L 29/786* (2006.01)

(58) Field of Classification Search
CPC . H01L 29/423; H01L 29/786; H01L 29/7825;
H01L 29/4236; H01L 29/7869; H01L
29/0653; H01L 29/66696; H01L
29/66704; H01L 29/66734; H01L
29/41766; H01L 29/0865; H01L
29/78642; H01L 29/0886; H01L 29/0873;
H01L 29/0869; H01L 29/0856; H01L
9/0891; H01L 9/0843; H01L 9/66643;
H01L 9/66636; H01L 9/49; H01L 9/435;
H01L 9/783; H01L 9/7833; H01L 9/6659;
H01L 9/8234; H01L 21/8236; H01L
21/8238; H01L 21/82345; H01L
21/823456; H01L 21/823462; H01L
21/82385; H01L 21/823857; H01L
21/823842; H01L 21/823814; H01L
21/823425; H01L 21/823418; H01L
27/06; H01L 27/07; H01L 27/08; H01L
27/0617; H01L 27/0623; H01L 27/0635;
H01L 27/098; H01L 27/105; H01L
27/0705; H01L 27/0722; H01L 27/085;
H01L 27/11597; H01L 27/1104
USPC ........................................................ 438/197
See application file for complete search history.

(56) References Cited

U.S. PATENT DOCUMENTS

| 7,547,603 | B2 | 6/2009 | Chen et al. | |
|---|---|---|---|---|
| 8,227,315 | B2 | 7/2012 | Hebert | |
| 2002/0119639 | A1* | 8/2002 | Ridley | H01L 29/7813 |
| | | | | 257/E29.267 |
| 2003/0096482 | A1* | 5/2003 | Hao | H01L 29/7813 |
| | | | | 438/303 |
| 2009/0039407 | A1 | 2/2009 | Vora | |
| 2009/0224314 | A1 | 9/2009 | Kitamura | |
| 2010/0193862 | A1 | 8/2010 | Kanazawa | |
| 2010/0200912 | A1* | 8/2010 | Hsieh | H01L 29/66727 |
| | | | | 257/329 |
| 2011/0057241 | A1* | 3/2011 | Irani | H01L 21/76232 |
| | | | | 257/E27.06 |
| 2011/0159656 | A1* | 6/2011 | Song | H01L 29/0665 |
| | | | | 257/E21.409 |
| 2011/0220990 | A1 | 9/2011 | Chang et al. | |
| 2014/0015045 | A1 | 1/2014 | Su et al. | |

OTHER PUBLICATIONS

China Office Action for 201810846710.4, dated Aug. 28, 2020, 6 pages.
Extended European Search Report for corresponding EP Application No. 19841968.1, dated Mar. 24, 2022, 11 pages.
Fujishima et al., "A High-Density Low On-Resistance Trench Lateral Power MOSFET With a Trench Bottom Source Contact", IEEE Transactions on Electron Devices, vol. 49, No. 8, Aug. 2002, pp. 1462-1468.

* cited by examiner

MOSFET MANUFACTURING METHOD

CROSS-REFERENCE TO RELATED APPLICATIONS

This application claims priority to Chinese Patent Application No. 201810846710.4, filed on Jul. 27, 2018, entitled "MOSFET MANUFACTURING METHOD" the entire contents of which are incorporated herein by reference in its entirety for all purposes.

TECHNICAL FIELD

The present disclosure relates to the field of semiconductor manufacturing, in particular to a MOSFET manufacturing method.

BACKGROUND

As the integration of semiconductor integrated circuits becomes higher and higher, the size requirements for a single power unit are becoming more and more stringent. Miniaturized design has become one of the important indicators to measure the technological development of electronic components. In traditional high-voltage lateral devices, such as a laterally diffused metal oxide semiconductor field effect transistor (LDMOSFET), a source terminal and a drain terminal thereof are arranged side by side on the same side of the device, resulting in a larger size of the device. Especially when it is necessary to increase the withstand voltage value or on-resistance of the device, in order not to increase the size of the device, a spacer is generally formed at the drain terminal through a spacer process, and the spacer is used to increase the withstand voltage. However, at present, the spacer is usually formed by processes of photolithography and etching, and the alignment accuracy of the photolithography will have a certain deviation, which makes a thickness of a left spacer and a thickness of a right spacer of the drain terminal inconsistent, and the asymmetry of the thickness of the spacers will affect a performance of the device such as changing a breakdown voltage of the device.

SUMMARY

According to various embodiments of the present disclosure, a MOSFET manufacturing method is provided.

A MOSFET manufacturing method includes:

providing a wafer having a first conductivity type well region formed on a substrate, and forming an oxide layer and a silicon nitride layer sequentially on the first conductivity type well region;

etching a part of the oxide layer and the silicon nitride layer to form an opening exposing the first conductivity type well region;

etching the first conductivity type well region to form a first trench in the first conductivity type well region opposite to the opening;

depositing a dielectric oxide layer on an inner surface of the first trench, performing an anisotropic etching to the dielectric oxide layer, and retaining the dielectric oxide layer on a sidewall of the first trench;

etching the first conductivity type well region to form a second trench in communication with the first trench by using the dielectric oxide layer as a mask, forming a gate on an inner wall of the second trench, forming a second conductivity type well region in the first conductivity type well region at a bottom of the second trench, forming a source in the second conductivity type well region, the source has a first conductivity type; and removing the oxide layer and the silicon nitride layer, forming a drain on the first conductivity type well region outside the trenches, the drain has the first conductivity type and is located between the two dielectric oxide layers.

These and other objects, advantages, purposes, and features will become apparent upon review of the following detailed description in conjunction with the drawings.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE EMBODIMENTS

Figure 1:
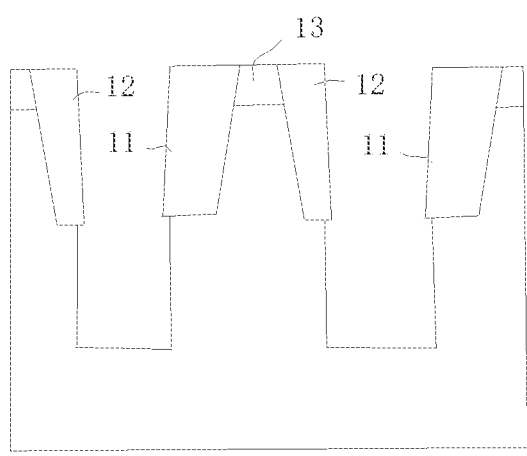
FIG. 1 is a cross-sectional view of a spacer formed by a conventional process.

In order to make the purpose, technical solutions and advantages of the embodiments of the present disclosure clearer, the technical solutions in the embodiments of the present disclosure will be described clearly and completely with reference to the accompanying drawings in the embodiments of the present disclosure. Obviously, the described embodiment is a part of the embodiments of the present disclosure, but not all the embodiments. The components of the embodiments of the present disclosure generally described and illustrated in the drawings herein may be arranged and designed in various different configurations.

Unless defined otherwise, all technical and scientific terms used herein have the same meaning as commonly understood by people who are skill in the art to which the present disclosure belongs. The terms used herein in the specification of the present disclosure is only for the purpose of describing specific embodiments, and is not intended to limit the present disclosure. The term "and/or" as used herein includes any and all combinations of one or more of the associated listed items.

In order to thoroughly understand the present disclosure, detailed steps and structures will be proposed in the following description to explain the technical solution proposed by the present disclosure. The preferred embodiments of the present disclosure are described in detail as follows. However, in addition to these detailed descriptions, the present disclosure may also have other embodiments.

As shown in FIG. 1, a width of a dielectric oxide layer (spacer) 11 formed on a left side of a drain 13 by using conventional processes of photolithography and etching is greater than a width of a dielectric oxide layer (spacer) 12 on a right side of the drain 13, and asymmetric thicknesses of the spacers will affect performance of a device, such as changing a breakdown voltage of the device.

Figure 2:
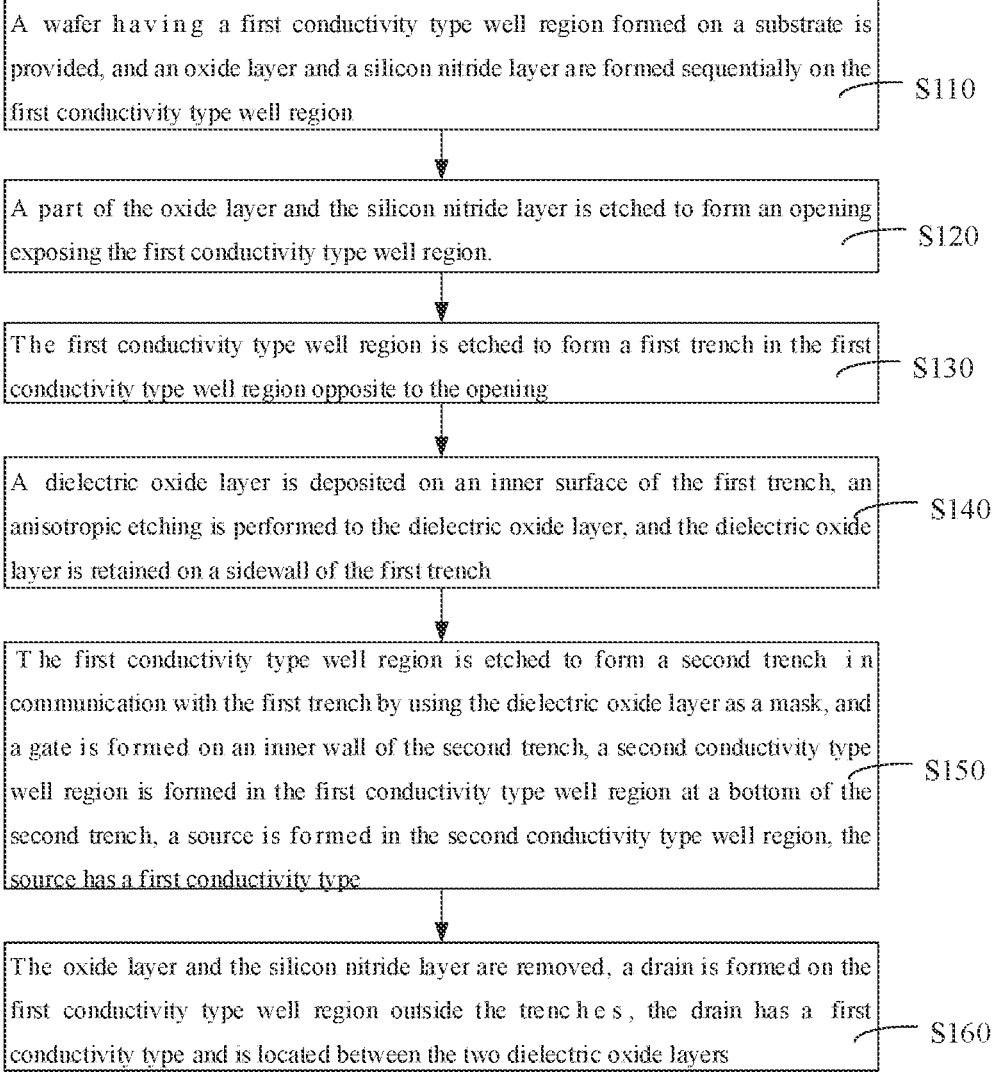
FIG. 2 is a flowchart of a MOSFET manufacturing method in an embodiment.

FIG. 2 is a flowchart of a MOSFET manufacturing method in an embodiment. The MOSFET manufacturing method includes the following steps:

In step S110, a wafer having a first conductivity type well region formed on a substrate is provided, and an oxide layer and a silicon nitride layer are formed sequentially on the first conductivity type well region.

Figure 3A:
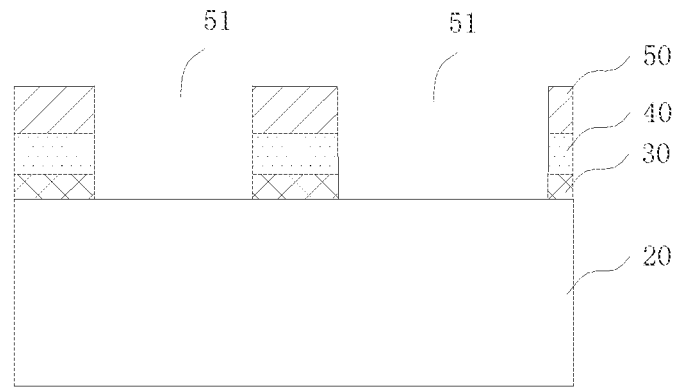
FIGS. 3a to 3f are cross-sectional views of a device after each intermediate step of manufacturing the MOSFET structure by using the MOSFET manufacturing method in an embodiment is completed.

A semiconductor substrate is provided. The semiconductor substrate can be made of undoped monocrystalline silicon, monocrystalline silicon doped with impurities, silicon-on-insulator (SOI), stacked silicon-on-insulator (SSOI), stacked silicon germanium-on-insulator (S—SiGeOI), silicon germanium-on-insulator (SiGeOI), and germanium-on-insulator (GeOI), etc. As shown in FIG. 3a, a first conductivity type well region 20 is formed on the semiconductor substrate (not shown), an oxide layer 30 is formed on the first conductivity type well region 20, and a silicon nitride layer 40 is formed on the oxide layer 30. In an embodiment, the oxide layer 30 obtained through an oxidation process is a silicon oxide layer, and then the silicon nitride layer 40 is formed on the silicon oxide layer 30 through a deposition process.

In step S120, a part of the oxide layer and the silicon nitride layer is etched to form an opening exposing the first conductivity type well region.

The specific process steps of forming the opening include: a layer of photoresist 50 is coated on a surface of the silicon nitride layer 40, a position of the opening is defined by photolithography and etching, and the silicon nitride layer 40 and the oxide layer 30 are etched by reactive ion etching to form the opening 51, and the first conductivity type well region at the opening 51 is exposed. A plurality of openings 51 can be formed according to a structure of the device, and widths of the openings 51 can also be determined according to needs, as long as openings of different widths are defined in the photolithography step.

In step S130, the first conductivity type well region is etched to form a first trench in the first conductivity type well region opposite to the opening.

Figure 3B:
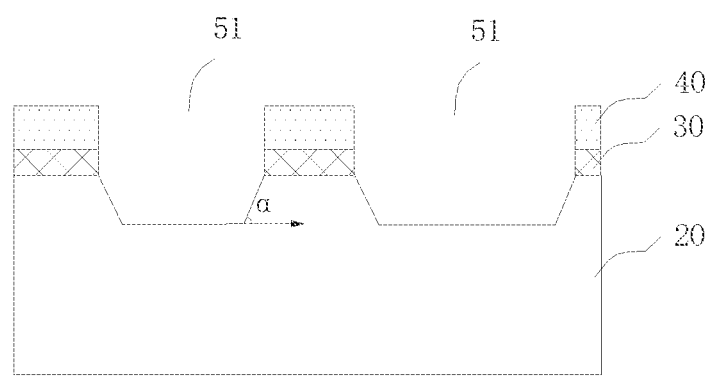

As shown in FIG. 3b, since the first conductivity type well region 20 below the opening 51 is exposed, the first trench opposite to the opening 51 can be formed below the opening 51 by etching the first conductivity type well region 20 by ion reaction. In this embodiment, the photoresist mask applied in step S120 is not removed, and the first conductivity type well region 20 is etched using the photoresist as a mask, and the photoresist is removed after the first trench is formed. In another embodiment, the photoresist may be removed after the opening 51 is formed, and the first conductivity type well region may be etched by using silicon nitride as a mask. A depth and a shape of the first trench can be changed by adjusting etching parameters. In this embodiment, spacing of the sidewalls of the first trench decrease linearly from the opening of the first trench to a bottom of the first trench. The first trench has a shape of an inverted trapezoid, and an inclination angle α of the sidewall of the first trench may be 78° to 90°. In an embodiment, the method for forming the aforementioned trench with a trapezoidal structure is anisotropic dry etching. Halogen gas, such as chlorine gas, hydrogen bromide, nitrogen trifluoride, and hexafluoride sulfur, etc., can be used as etching gas. After the etching gas reacts with silicon, volatile gas is generated, which is pumped away during the etching process, and the trench is gradually etched. At the same time, in order to control the shape of the trench, such as generating a trapezoidal trench, it is necessary to simultaneously add auxiliary gas, so as to continuously form a polymer on the sidewall, such that the opening etched downward becomes smaller and smaller, and the sidewall of the trench is inclined. In an embodiment, tetrafluoromethane, helium, and oxygen are used as auxiliary gases. During the reaction, tetrafluoromethane forms a polymer, which is deposited on a surface of the trench to protect the trench from further etching. The helium and the oxygen can react with the polymer to remove the polymer on the surface of the trench. The area not covered by the polymer will continue to be etched by the etching gas. The trench in the shape of the trapezoid with different inclination angles can be obtained by controlling a formation rate and a removing rate of the polymer. For ease of understanding, specific numbers are taken as an example. Before etching, the opening of the mask has a width of 10, and a trench 1 is etched downward through the reaction of the etching gas and silicon. The tetrafluoromethane in the auxiliary gas forms the polymer, which will be deposited on an inner wall of the trench. Assuming the deposition thickness is 1, the polymer prevents the trench from being further etched, and the helium and the oxygen in the auxiliary gas will remove the polymer at the bottom of the trench due to the anisotropy of the auxiliary gas, but they will not remove the polymer on the sidewall of the trench. The polymer on the sidewall is used as a mask, and a width of the opening thereof is 8. The etching gas continues to etch downward to form a trench 2. The aforementioned process is repeated until a trench N is formed. In the process of etching downward, the width of the opening of the mask becomes smaller and smaller, that is, the widths of the trench 1 to the trench N becomes smaller and smaller from top to bottom, and the first trench formed by all of the trench 1 to the trench N has the shape of the trapezoid. By controlling the formation rate and the removing rate of the polymer, the inclination angle α of the sidewall can be controlled. The faster the removing rate, the greater the inclination angle α of the sidewall. At the same time, by controlling an etching rate and an etching time, the depth of the trench can be controlled. In this embodiment, the depth of the first trench may range from 0.1 μm to 1 μm, but is not limited hereto.

In step S140, a dielectric oxide layer is deposited on an inner surface of the first trench, an anisotropic etching is performed to the dielectric oxide layer, and the dielectric oxide layer is retained on a sidewall of the first trench.

Figure 3C:
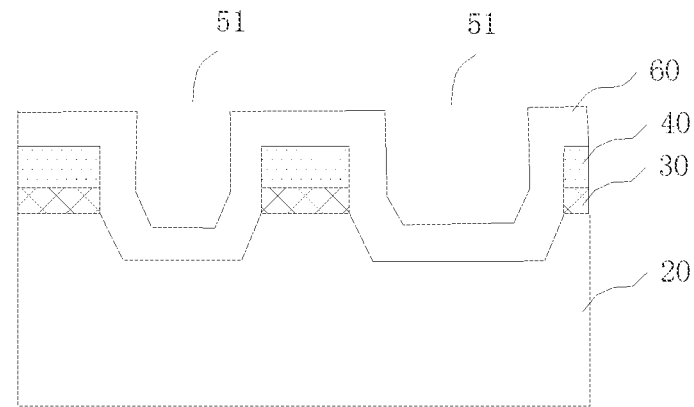

As shown in FIG. 3c, a dielectric oxide layer 60 is formed on a surface of the structure formed in step S130 through the deposition process. The dielectric oxide layer 60 specifically covers an upper surface of the silicon nitride layer 40, the opening and the inner surface of the first trench, that is, the dielectric oxide layer 60 is filled in the first trench, but the first trench is not completely filled. During the deposition process, a reaction extent is the same everywhere on a surface of the semiconductor structure, thus the formed dielectric oxide layer 60 has a uniform thickness, that is, the thickness of the dielectric oxide layer 60 is constant, which can range from 400 Å to 8000 Å, but is not limited hereto. At the same time, dielectric oxide layers with different thicknesses can be obtained by changing deposition process parameters, such as adjusting temperature, pressure and other parameters. In this embodiment, the dielectric oxide layer 60 has a thickness of 4000 Å, and the dielectric oxide layer 60 may specifically be a silicon oxide layer. In this embodiment, the deposition process is specifically chemical vapor deposition. Monosilane ($SiH_4$) and oxygen ($O_2$) are fed into the reaction chamber, and the two react to form a silicon dioxide ($SiO_2$) film.

Figure 3D:
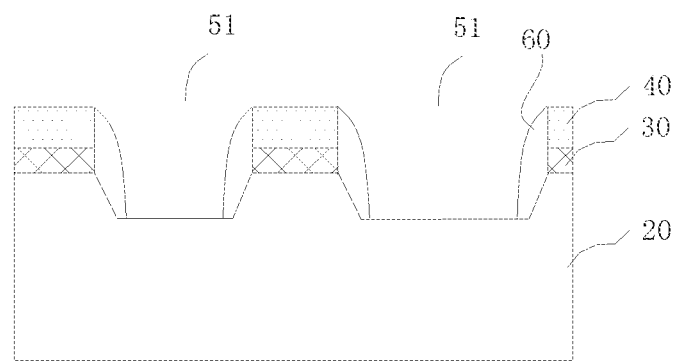

As shown in FIG. 3d, after the dielectric oxide layer 60 is generated, it is etched downwards by anisotropic etching. Since an etching direction is selected to be downward and the etching rate on the side edge of the dielectric oxide layer is almost zero when the anisotropic etching is performed, the dielectric oxide layer on the sidewall of the first trench will be preserved after the etching is completed. Since the dielectric oxide layers formed by the aforementioned deposition process has a uniform thickness, the dielectric oxide layers formed on the sidewall of the first trench are symmetrical with each other. When the dielectric oxide layers 60 are etched under the same conditions, the residual dielectric oxide layers on the sidewall are also symmetrical to each other. In this embodiment, a dry anisotropic etching is selected as the anisotropic etching.

Figure 3E:
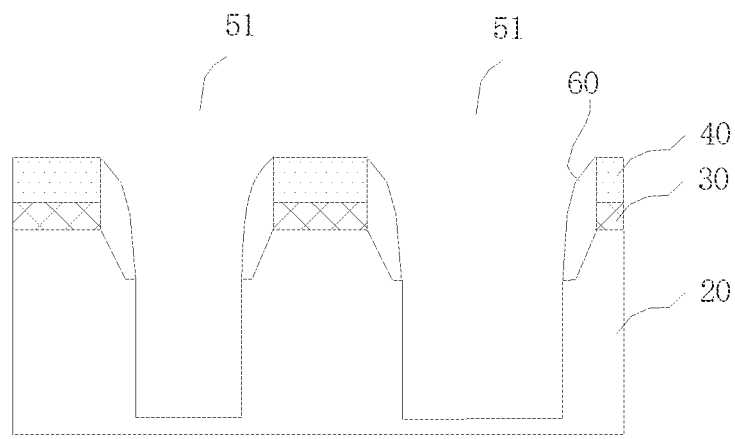

In step S150, the first conductivity type well region is etched to form a second trench in communication with the first trench by using the dielectric oxide layer as a mask, a gate is formed on an inner wall of the second trench, a second conductivity type well region is formed in the first conductivity type well region at a bottom of the second trench, a source is formed in the second conductivity type well region, the source has a first conductivity type. In an embodiment, the following specific steps are included:

In step S151, the first conductivity type well region 20 is continually etched downward by using the remaining dielectric oxide layer 60 as a mask, so as to form the second trench. The first trench and the second trench in the same vertical direction are communicated, as shown in FIG. 3e. In an embodiment, a depth of the second trench is greater than the depth of the first trench, and the depth of the second trench may range from 0.5 μm to 8 μm, but is not limited hereto. In this embodiment, the second trench has a depth of 2 μm.

In step S152, a gate oxide layer 71 is formed on the inner wall of the second trench, a thickness of the gate oxide layer 71 is less than the thickness of the dielectric oxide layer 60. In a specific process, a thermal oxidation process can be used to form the gate oxide layer 71. In this process, the gate oxide layer 71 can only be formed on the inner wall of the second trench, that is, on a surface of the first conductivity type well region (silicon) 20. Since the dielectric oxide layer 60 is formed on the sidewall of the first trench, the gate oxide layer 71 will not be formed on a surface of the sidewall of the first trench.

In step S153, a polysilicon gate 72 is formed on the gate oxide layer 71, and the polysilicon gate 72 is filled in a part area of the bottom and the sidewall of the second trench. In a specific process, the polysilicon may be filled in the trench by depositing, and then the polysilicon may be etched to a predetermined thickness, and the polysilicon gate 72 with the predetermined thickness is formed at the bottom of the trench. Then a first insulating oxide layer 81 is formed on a surface of the polysilicon gate 72 and the sidewall of the trench. The first insulating oxide layer 81, the polysilicon gate 72 and the gate oxide layer 71 are etched downward through processes of photolithography and etching to expose the bottom of the trench, the polysilicon gate 72 and the first insulating oxide layer 81 are preserved on the sidewall of the trench.

Figure 3F:
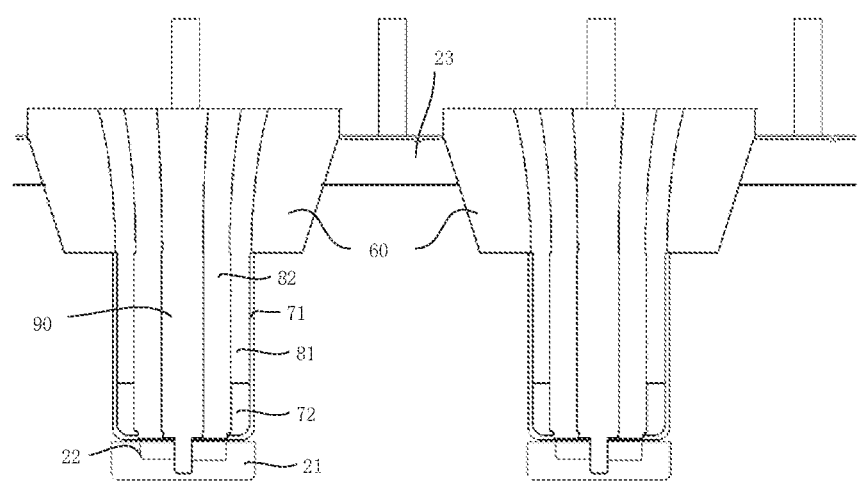

In step S154, an opening is formed between the polysilicon gates 72 to expose the bottom of the trench through the aforementioned etching step. As shown in FIG. 3f, a second conductivity type well region 21 is formed in the first conductivity type well region by the opening, and then a source 22 is formed in the second conductivity type well region 21. In this embodiment, ions of the second conductivity type are implanted into the trench, and the second conductivity type well region 21 is formed below the second trench; then ions of the first conductivity type are implanted into the trench, and the source 22 is formed in the second conductivity type well region 21. The first insulating oxide layer 81 on the sidewall of the trench serves as a barrier layer during the implantation of the ions of the first conductivity type and the second conductivity type. After the source is formed, the second insulating oxide layer 82 is filled in the trench to isolate the gate and the source.

In an embodiment, the source 22 is led out of a surface of the MOSFET by a conductive plug 90. The conductive plug 90 extends through the first trench, the second trench and the source 22, and is in contact with the second conductivity type well region 21.

In step S160, the oxide layer and the silicon nitride layer are removed, a drain is formed on the first conductivity type well region outside the trenches, the drain has the first conductivity type and is located between the two dielectric oxide layers.

In combination with 3f, the oxide layer 30 and the silicon nitride layer 40 are etched and removed, and the first conductivity type well region at the corresponding position is exposed. The ions of the first conductivity type are implanted to form a drain 23, which is located between the two dielectric oxide layers 60. In this solution, at least two sets of trenches are formed, and each set of the first trenches have a set of dielectric oxide layers correspondingly on the sidewalls thereof, that is, there are at least four sets of symmetrical dielectric oxide layers. The drain 23 is formed above the first conductivity type well region between adjacent two trenches, and the drain 23 has symmetrical dielectric oxide layers 60 on both sides thereof, and the dielectric oxide layers 60 form two spacers of the drain. Specifically, the drain 23 can also be led out of the surface of the MOSFET by a conductive plug.

In the MOSFET obtained by the aforementioned method, the source terminal and the drain terminal thereof are buried in the device by a deep trench process to form a channel region in the vertical direction, which can minimize a lateral size required by a high-voltage device. The channel region of the MOSFET includes the dielectric oxide layer 60, the gate oxide layer 71, the first insulating oxide layer 81, and the second insulating oxide layer 82. Due to the thicker dielectric oxide layer 60, it has a greater impact on the on-resistance of the channel, that is, it has a greater impact on the breakdown voltage of the device. If the spacers on both sides of the drain are asymmetrical, assuming that a width of the left spacer is larger than a width of the right spacer, since the wider the width of the spacer, the higher the breakdown voltage can be withstand, if a device with a breakdown voltage of 100V needs to be produced, the width of the left spacer is larger than the width of the right spacer due to process deviations, then a withstand voltage level of the channel on the left side is higher than a withstand voltage level of the channel on the right side. For example, if the breakdown voltage on the left side is 110V, and the breakdown voltage on the right side is 90V, then an overall breakdown voltage of the device is 90V, such that a final actual breakdown voltage of the device is less than a preset breakdown voltage, which cannot meet an actual demand.

In conventional processes, the dielectric oxide layer is usually formed by processes of photolithography and etching, that is, after the first trench is formed, the trench is full of the dielectric oxide, and the portion to be etched is defined by photolithography, which involves the alignment of the mask. The dielectric oxide in a middle portion is etched away by an etching process, and the dielectric oxide on the sidewall of the first trench is preserved due to the protection of the photoresist. Due to the misalignment of the lithography machine, the dielectric oxide that has not been etched is difficult to be completely symmetrical. As shown in FIG. 1, a width of the dielectric oxide layer 11 on the left side of the drain 13 is greater than a width of the dielectric oxide layer 12 on the right side of the drain 13, which will affect a performance of the device.

In the present solution, after the dielectric oxide layer is deposited on the surface of the first trench, the thickness of the dielectric oxide layer generated by the deposition is uniform. In the same etching environment, etching conditions are the same everywhere on the surface of the structure. The dielectric oxide layers remaining on both sidewalls of the first trench are symmetrical to each other. This step omits the step of photolithography symmetry, so a problem of asymmetrical dielectric oxides on both sides of the trench due to deviations in alignment will no longer exist, so that the device has a better symmetry and a good device performance is ensured. At the same time, in this solution, a length of the dielectric oxide layer on the sidewall thereof can be controlled by controlling the depth of the first trench, the thickness of the dielectric oxide layer can be controlled by controlling deposition parameters, and thickness of the dielectric oxide layer on the sidewall can be adjusted by controlling the etching parameters.

In this embodiment, the first conductivity type is N type, and the second conductivity type is P type. Accordingly, the second conductivity type well region 21 is a P well, and the first conductivity type well region 20 is a high voltage N well. In other embodiments, the first conductivity type may be P type, and the second conductivity type may be N type.

The technical features of the embodiments described above may be arbitrarily combined. For the sake of brevity of description, not all possible combinations of the technical features in the aforementioned embodiments are described. However, as long as there is no contradiction between the combinations of these technical features, all should be considered as the scope of this specification.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. A MOSFET manufacturing method, comprising:
   providing a wafer having a first conductivity type well region formed on a substrate, and forming an oxide layer and a silicon nitride layer sequentially on the first conductivity type well region;
   etching a part of the oxide layer and the silicon nitride layer to form an opening exposing the first conductivity type well region;
   etching the first conductivity type well region to form a first trench in the first conductivity type well region opposite to the opening;
   depositing a dielectric oxide layer on an inner surface of the first trench, performing an anisotropic etching to the dielectric oxide layer, and retaining the dielectric oxide layer on a sidewall of the first trench;
   etching the first conductivity type well region to form a second trench in communication with the first trench by using the dielectric oxide layer as a mask, forming a gate on an inner wall of the second trench, forming a second conductivity type well region in the first conductivity type well region at a bottom of the second trench, forming a source in the second conductivity type well region, the source having a first conductivity type; and
   removing the oxide layer and the silicon nitride layer, forming a drain on the first conductivity type well region outside the trenches, the drain having the first conductivity type and being located between the two dielectric oxide layers.

2. The MOSFET manufacturing method according to claim 1, wherein spacing of the sidewalls of the first trench decrease linearly from an opening of the first trench to a bottom of the first trench.

3. The MOSFET manufacturing method according to claim 2, wherein an inclination angle of the sidewall of the first trench is 78° to 90°.

4. The MOSFET manufacturing method according to claim 2, wherein the etching the first conductivity type well region to form the first trench specifically is:
   continuously depositing a polymer on the sidewall of the first trench during the etching process to etch the sidewall having an inclination angle.

5. The MOSFET manufacturing method according to claim 4, wherein the polymer is tetrafluoromethane.

6. The MOSFET manufacturing method according to claim 5, wherein the continuously depositing the polymer on the sidewall of the first trench comprises:
   depositing the polymer on an inner wall of the trench; and
   performing an anisotropic etching to the polymer by using helium and oxygen to remove the polymer at the bottom of the trench, and retaining the polymer on the sidewall of the trench.

7. The MOSFET manufacturing method according to claim 1, wherein a thickness of the dielectric oxide layer is 400 Å to 8000 Å.

8. The MOSFET manufacturing method according to claim 1, wherein the dielectric oxide layer is a silicon oxide layer.

9. The MOSFET manufacturing method according to claim 1, wherein the forming the dielectric oxide layer on the inner surface of the first trench specifically is:
   depositing the dielectric oxide layer in the first trench by a chemical vapor deposition process.

10. The MOSFET manufacturing method according to claim 1, wherein the anisotropic etching is dry etching.

11. The MOSFET manufacturing method according to claim 1, wherein a depth of the second trench is larger than a depth of the first trench.

12. The MOSFET manufacturing method according to claim 1, wherein the forming the gate on the inner wall of the second trench comprises:
   forming a gate oxide layer on the inner wall of the second trench, wherein a thickness of the gate oxide layer is less than a thickness of the dielectric oxide layer; and
   forming a polysilicon gate on the gate oxide layer, wherein the polysilicon gate is filled in a part area of the bottom and the sidewall of the second trench.

13. The MOSFET manufacturing method according to claim 12, wherein the forming the polysilicon gate on the gate oxide layer, and filling the polysilicon gate in a part area of the bottom and the sidewall of the second trench comprises:

filling the polysilicon in the trench by depositing; and etching the polysilicon to a predetermined thickness, and forming the polysilicon gate with the predetermined thickness at the bottom of the trench.

14. The MOSFET manufacturing method according to claim 13, wherein the forming the second conductivity type well region in the first conductivity type well region at the bottom of the second trench and forming the source in the second conductivity type well region comprises:

forming a first insulating oxide layer on a surface of the polysilicon gate and the sidewall of the trench, etching the first insulating oxide layer, the polysilicon gate, and the gate oxide layer downward through processes of photolithography and etching to form an opening exposing the bottom of the trench, and retaining the polysilicon gate and the first insulating oxide layer on the sidewall of the trench;

forming the second conductivity type well region in the first conductivity type well region by the opening exposing the bottom of the trench, and then forming the source in the second conductivity type well region; and filling a second insulating oxide layer in the trench to isolate the gate and the source.

15. The MOSFET manufacturing method of claim 1, wherein the source is led out by a conductive plug, and the conductive plug extends through the first trench, the second trench, and the source, and is in contact with the second conductivity type well region.

\* \* \* \* \*